United States Patent
Funada (10) Patent No.: US 10,881,003 B1
(45) Date of Patent: Dec. 29, 2020

(54) WIRING BOARD

(71) Applicant: Naohiro Funada, Kanagawa (JP)

(72) Inventor: Naohiro Funada, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 16/936,487

(22) Filed: Jul. 23, 2020

(30) Foreign Application Priority Data

Oct. 24, 2019 (JP) .................................. 2019-193804

(51) Int. Cl.
*H05K 1/18* (2006.01)

(52) U.S. Cl.
CPC ... *H05K 1/181* (2013.01); *H05K 2201/10015* (2013.01); *H05K 2201/10439* (2013.01)

(58) Field of Classification Search
CPC ......... H05K 1/181; H05K 2201/10439; H05K 2201/10015
USPC ......................................................... 174/260
See application file for complete search history.

(56) References Cited

U.S. PATENT DOCUMENTS

| | | | | |
|---|---|---|---|---|
| 5,530,622 A | * | 6/1996 | Takiar | H05K 5/0269 361/737 |
| 6,541,711 B1 | * | 4/2003 | Dube | H05K 1/0219 174/255 |

FOREIGN PATENT DOCUMENTS

JP  2009-218437  9/2009

* cited by examiner

*Primary Examiner* — Sherman Ng
(74) *Attorney, Agent, or Firm* — Oblon, McClelland, Maier & Neustadt, L.L.P.

(57) ABSTRACT

A wiring board includes a substrate, a connector on the substrate, and at least one monolithic ceramic capacitor including a pair of electrodes and mounted at a mounting angle on the substrate. The connector has an insertion-removal position at which a stress starts in insertion and removal of a counterpart connector into and from the connector. When a first line segment connects centers of the electrodes in a plan view, and a second line segment connects a center of the insertion-removal position and a center of the first line segment in the plan view, the mounting angle is an angle between the first line segment and the second line segment and is from 0 to 90 degrees. The mounting angle is from 0 to 5 degrees or from 85 to 90 degrees in an area within 10 mm from a periphery of the connector on the substrate.

4 Claims, 7 Drawing Sheets

WIRING BOARD

CROSS-REFERENCE TO RELATED APPLICATION

This patent application is based on and claims priority pursuant to 35 U.S.C. § 119(a) to Japanese Patent Application No. 2019-193804, filed on Oct. 24, 2019, in the Japan Patent Office, the entire disclosure of which is hereby incorporated by reference herein.

BACKGROUND

Technical Field

The present disclosure relates to a wiring board.

Related Art

A capacitor is one of electronic components mounted on a wiring board. Examples of capacitors include ceramic capacitors, tantalum capacitors, and aluminum electrolytic capacitors. Since a plurality of capacitors are usually used on one wiring board, various ingenuities have been tried for the arrangement of the capacitors.

SUMMARY

According to an embodiment of this disclosure, a wiring board includes a substrate, a connector mounted on the board, and at least one monolithic ceramic capacitor including a pair of electrodes and mounted on the board. In the connector, an insertion-removal position signifies a position at which a stress starts in insertion and removal of a counterpart connector into and from the connector. When, in a plan view, a first line segment connects respective centers of the pair of electrodes and a second line segment connects a center of the insertion-removal position and a center of the first line segment, a mounting angle of the capacitor relative to the connector is defined as an angle between the first line segment and the second line segment and in a range of from 0 to 90 degrees. In an area within 10 mm from a periphery of the connector on the substrate, the mounting angle is in a range of from 0 to 5 degrees or a range of from 85 to 90 degrees.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

The accompanying drawings are intended to depict embodiments of the present disclosure and should not be interpreted to limit the scope thereof. The accompanying drawings are not to be considered as drawn to scale unless explicitly noted.

DETAILED DESCRIPTION

In describing embodiments illustrated in the drawings, specific terminology is employed for the sake of clarity. However, the disclosure of this patent specification is not intended to be limited to the specific terminology so selected, and it is to be understood that each specific element includes all technical equivalents that have the same function, operate in a similar manner, and achieve a similar result.

Referring now to the drawings, wherein like reference numerals designate identical or corresponding parts throughout the several views thereof, embodiments of this disclosure are described. As used herein, the singular forms "a," "an," and "the" are intended to include the plural forms as well, unless the context clearly indicates otherwise.

Below, embodiments of the present disclosure are described with reference to accompanying drawings. In each of the drawings, the same reference numerals are allocated to components or portions having the same configuration, and redundant descriptions of the same components may be omitted.

Figure 1:
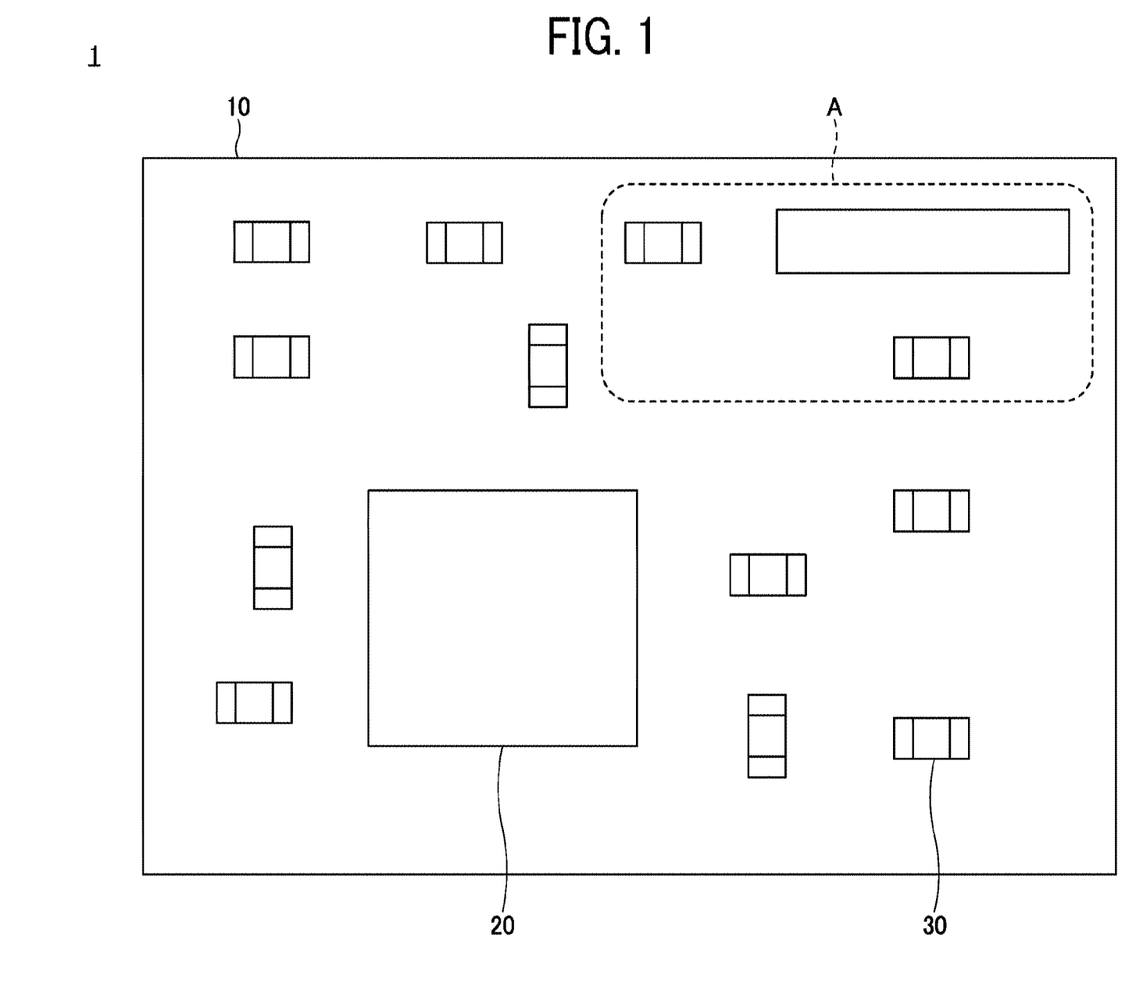
FIG. 1 is a plan view illustrating a wiring board according to an embodiment of the present disclosure.

FIG. 1 is a plan view illustrating a wiring board according to the present embodiment. Referring to FIG. 1, a wiring board 1 includes a substrate 10, an active component 20, and a passive component 30.

The active component 20 and the passive component 30 are mounted on one side of the substrate 10. However, another active component 20 and another passive component 30 can be mounted also on the other side of the substrate 10 as double-sided mounting.

Terminals of the active component 20 and the passive component 30 are connected to a component mounting land on the substrate 10 by soldering or the like. The substrate 10 is mounted with a wiring pattern for connecting required portions of terminals of the active component 20 and the passive component 30 to each other, power supply wiring (VDD wiring) connected to the active component 20, and ground wiring (GND wiring).

The substrate 10 is not particularly limited, but is, for example, a resin substrate (a glass epoxy substrate, a phenolic paper substrate, etc.), a ceramic substrate, a silicon substrate, or the like. The substrate 10 can be anyone of a single-sided substrate having a wiring pattern on one side, a double-sided substrate having wiring patterns on both sides, and a multi-layer substrate in which a plurality of wiring patterns are laminated via insulation layers.

The active component 20 is not particularly limited, but is, for example, a semiconductor integrated circuit, a transistor, a diode, or the like. The passive component 30 is not particularly limited, but is, for example, a capacitor, a resistor, an inductor, a connector, or the like.

Figure 2A:
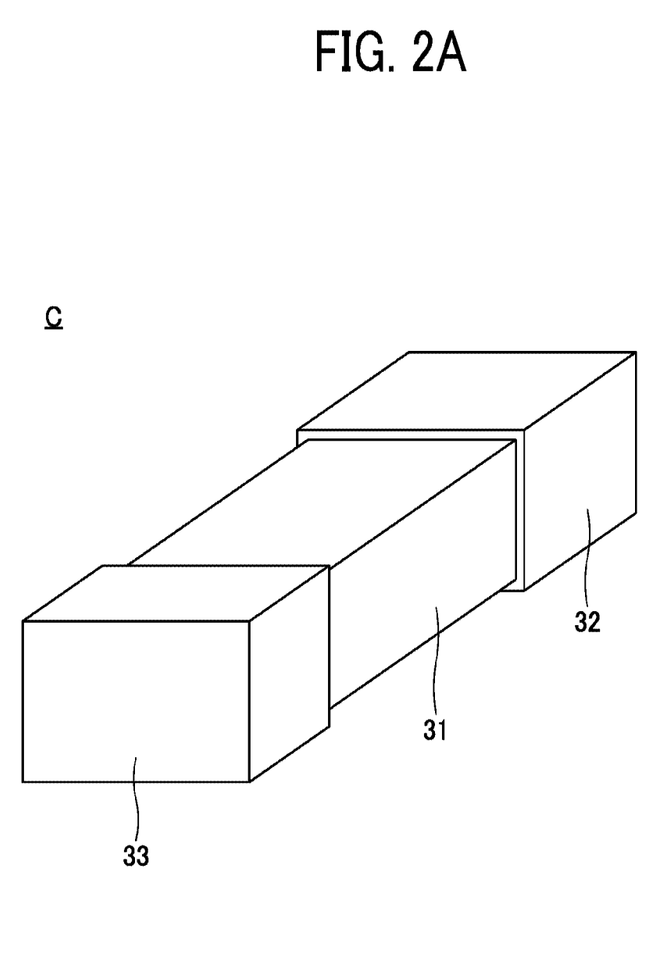
FIGS. 2A and 2B are views illustrating an appearance of a capacitor.
Figure 2B:
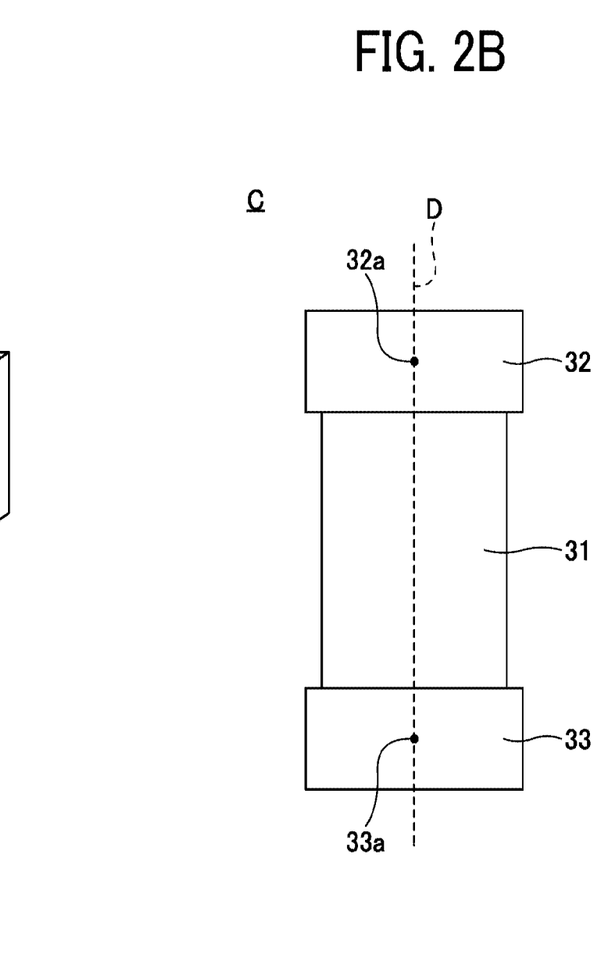

FIGS. 2A and 2B are views illustrating an external appearance of a capacitor. FIG. 2A is a perspective view, and FIG. 2B is a plan view. As illustrated in FIGS. 2A and 2B, a capacitor C (collectively signifying capacitors C1 and C2 of FIGS. 6A and 6B) includes a substantially rectangular parallelepiped body 31 and electrodes 32 and 33 on opposite sides of the body 31 from each other. The body 31 is, for example, a dielectric made of barium titanate or the like. The electrodes 32 and 33 are electric conductors and are made of, for example, copper plated with tin.

In the present embodiment, as illustrated in FIG. 2B, in a plan view, a direction indicated by a broken line D in FIG. 2B, in which a center 32a of the electrode 32 is connected with a center 33a of the electrode 33, is referred to as a mounting direction D of the capacitor C.

It is possible that various stresses are applied to the wiring board 1. Depending on the direction of the stress, a component mounted on the wiring board 1 may be cracked, resulting in a short circuit. In particular, when a monolithic ceramic capacitor is cracked receiving a stress, a short circuit may occur. Therefore, it is important to determine the position and the direction of the monolithic ceramic capacitor relative to an insertion-removal position of a female connector.

Therefore, the inventors have studied the relationship between the direction in which stress is applied to a monolithic ceramic capacitor and the possibility of occurrence of a crack in the monolithic ceramic capacitor. Hereinafter, unless otherwise specified, the term "capacitor" refers to a monolithic ceramic capacitor.

Figure 3A:
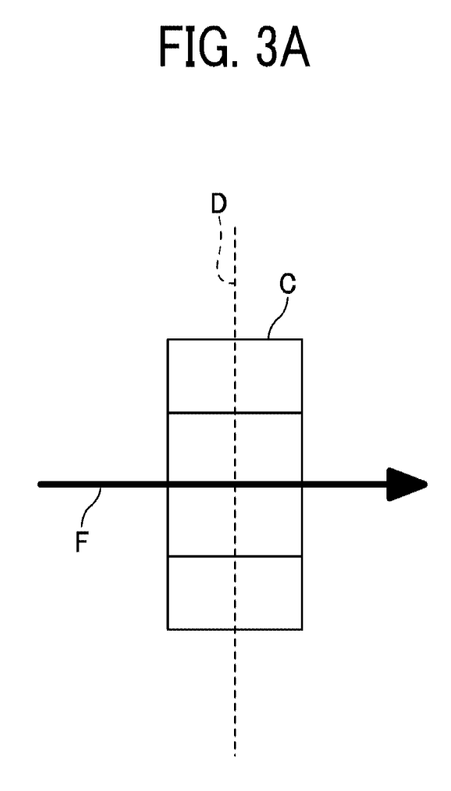
FIGS. 3A, 3B, and 3C illustrate relationships between a direction of stress and the possibility of occurrence of a crack in a capacitor.
Figure 3B:
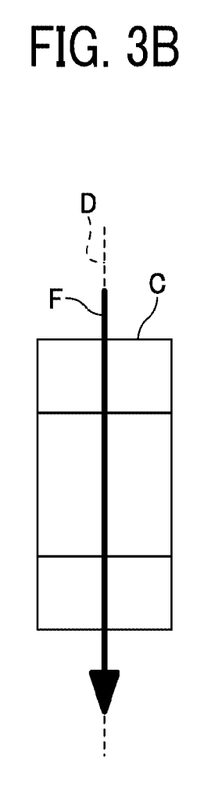

According to the studies by the inventors, the possibility of occurrence of a crack is relatively low in a case where the angle of a stress F is 90 degrees (perpendicular) to the mounting direction D of the capacitor C as illustrated in FIG. 3A and a case where the angle of the stress F is 0 degree (parallel) to the mounting direction D of the capacitor C as illustrated in FIG. 3B.

Figure 3C:
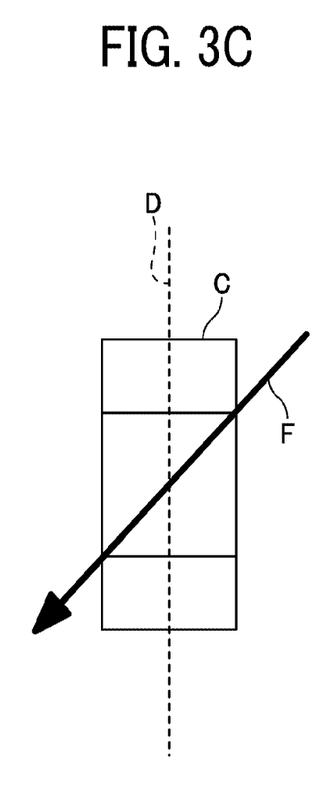

By contrast, when the angle of the stress F is 45 degrees to the mounting direction D of the capacitor C as illustrated in FIG. 3C, the possibility of occurrence of a crack is higher compared with the cases illustrated in FIGS. 3A and 3B.

The capacitor receives a stress mainly when a male connector is inserted into and removed from the female connector mounted on the substrate 10. The insertion-removal position can be located by assuming a which portion of the male connector is held by an operator when the male connector is inserted or removed. The insertion-removal position is a position of the female connector to which the force is applied most when the male connector is inserted thereto and removed thereof, and a position that is a starting point of the stress when the male connector is inserted and removed.

Figure 4A:
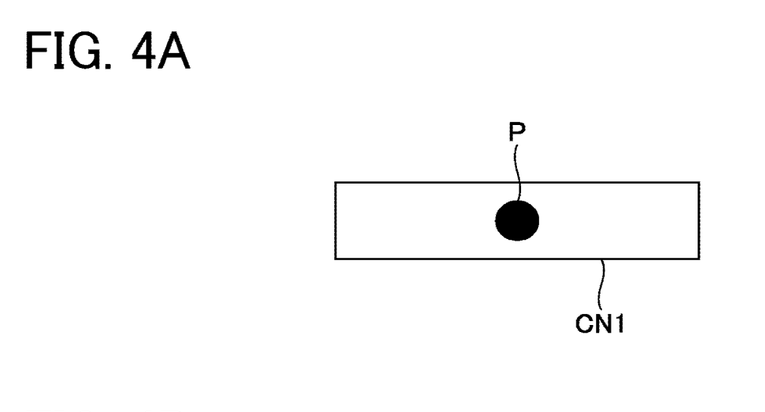
FIGS. 4A, 4B, and 4C are diagrams illustrating insertion-removal positions of a connector.

As illustrated in FIG. 4A, for example, in a case where a female connector CN1 is relatively short in the longitudinal direction thereof and a male connector can be inserted thereto and removed therefrom by holding a central portion of the male connector, an insertion-removal position P is in a central portion of the female connector CN1. That is, the female connector CN1 has one insertion-removal position P.

Figure 4B:
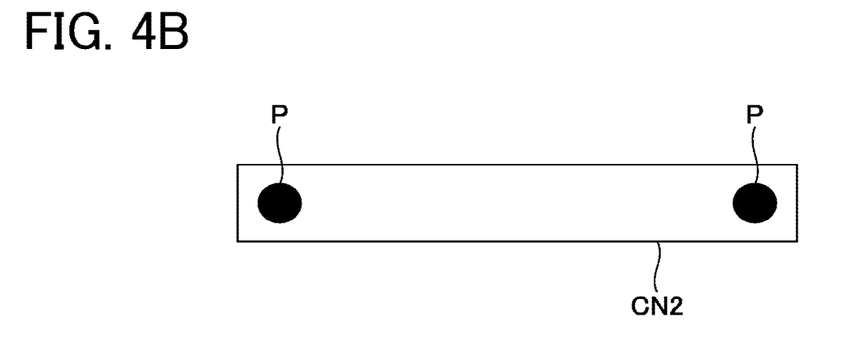
Figure 4C:
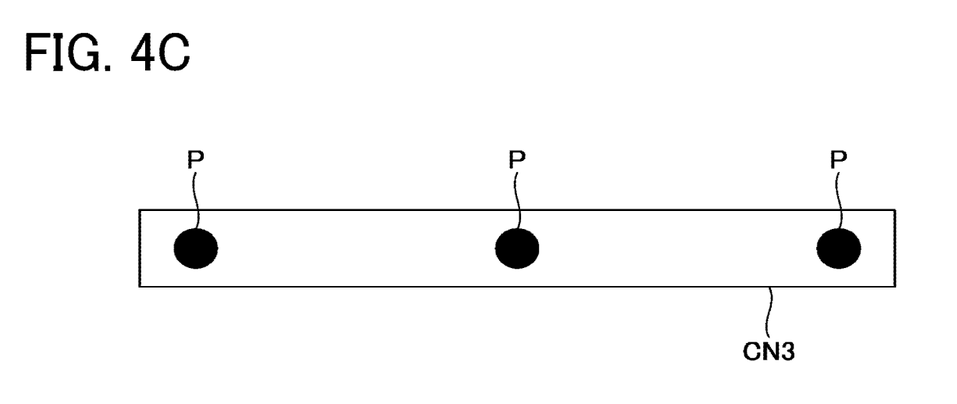

Alternatively, as illustrated in FIG. 4B, in a case where a female connector CN2 is relatively long in the longitudinal direction thereof and a male connector can be inserted thereto and removed therefrom by holding both ends of the male connector, the insertion-removal positions P are at both ends of the female connector CN2. That is, the female connector CN2 has two insertion-removal positions P. Alternatively, as illustrated in FIG. 4C, in a case where a female connector CN3 is longer in the longitudinal direction thereof and a male connector can be inserted thereto and removed therefrom by holding a central portion and both ends of the male connector, the insertion-removal positions P are in a central portion and both ends of the female connector CN3. That is, the female connector CN3 has three insertion-removal positions P.

Note that, even when the length in the longitudinal direction is relatively short and there is only one insertion-removal position, in some cases, insertion of the male connector is easier when an operator holds a portion of the male connector shifted from the center thereof, and the insertion-removal position in the female connector is shifted from the center of the male connector.

By thus assuming which portion of the male connector is held by an operator when inserted or removed, the insertion-removal position of the female connector (i.e., the start position of stress) can be located.

At the time of inserting or removing the connector, The stress is radially applied to the substrate 10 from the insertion-removal position of the female connector (or each insertion-removal position when there are a plurality of insertion-removal positions). Therefore, when the insertion-removal position of the female connector is located, a position, relative to the female connector, where a capacitor can be disposed and a position where the capacitor should not be disposed can be determined from information on connector mounting position on the substrate 10. That is, preferably, a capacitor is disposed at an angle at which failure is unlikely to be caused by the stress applied to the wiring board 1, considering the stress applied radially from the insertion-removal position of the female connector.

Figure 5:
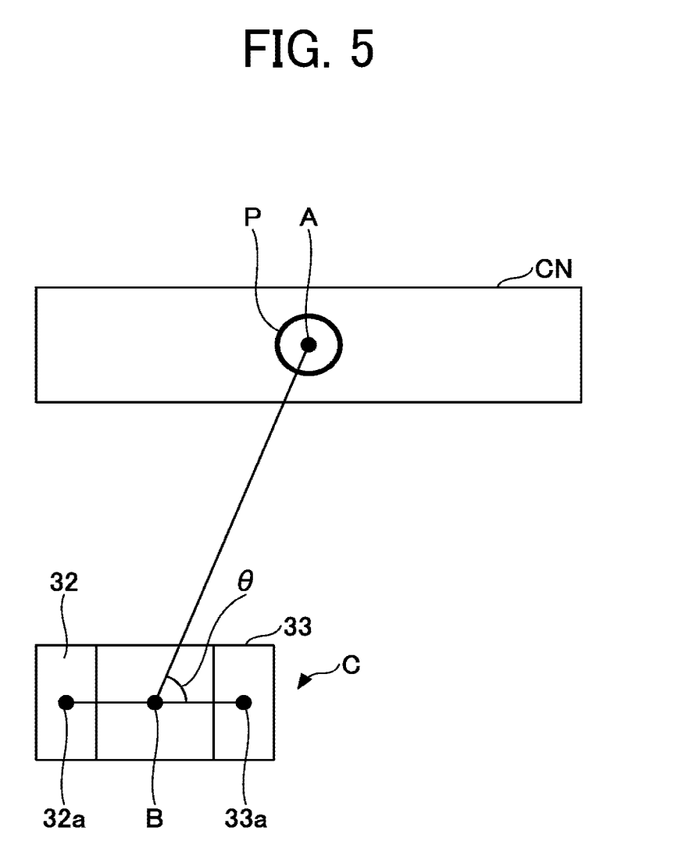
FIG. 5 is a diagram illustrating a mounting angle of the capacitor.

FIG. 5 is a diagram illustrating a mounting angle of a capacitor. FIG. 5 illustrates, in a plan view, a center point A of the insertion-removal position P of the connector CN, and a center point B of a first line segment connecting the center 32a of the electrode 32 of the capacitor C and the center 33a of the electrode 33. A second line segment connects the center point A of the insertion-removal position P and the center point B of the first line segment. In the present specification, the angle formed by the first line segment and the second line segment is defined as a mounting angle θ of the capacitor C relative to the insertion-removal position P of the connector CN. The mounting angle θ is in a range of from 0 to 90 degrees. That is, the mounting angle θ is an angle on the acute angle side rather than the obtuse angle side.

Figure 6A:
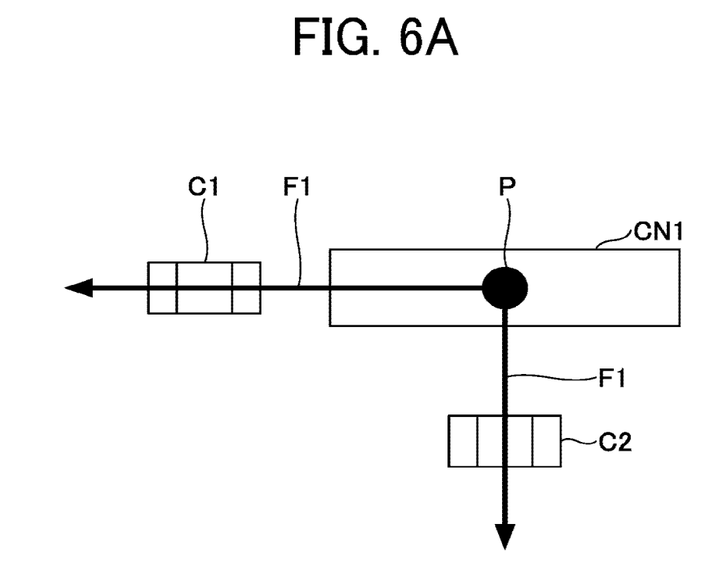
FIGS. 6A and 6B illustrate the relationship between the mounting angle of the capacitor and a likelihood of cracks in an example arrangement of the capacitor.
Figure 6B:
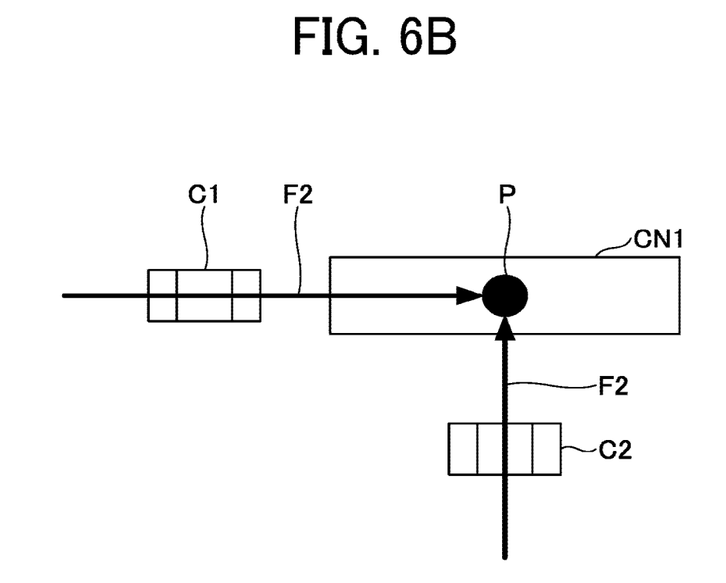

FIGS. 6A and 6B are enlarged views of an area A in FIG. 1 and illustrate the relationship between the mounting angle of the capacitor and the likelihood of cracks. FIGS. 6A and 6B illustrate the capacitors C1 and C2, which are monolithic ceramic capacitors, and a female connector CN1. The capacitors C1 and C2 and the connector CN1 are parts of the passive component 30 illustrated in FIG. 1.

When a male connector is inserted into the female connector CN1, a stress is generated radially from the insertion-removal position P of the connector CN1. In FIG. 6A, two arrows F1 schematically indicate a portion of the stress (hereinafter also "stress F1") radially generated from the insertion-removal position P of the connector CN1.

When the male connector is pulled out from the female connector CN1, a stress occurs in the direction opposite to that in FIG. 6A (that is, the direction from the periphery of the connector CN1 toward the insertion-removal position P). In FIG. 6B, two arrows F2 schematically indicate a portion of the stress (hereinafter also "stress F2") heading from the periphery of the connector CN1 toward the insertion-removal position P.

As described above with reference to FIGS. 3A to 3C, the possibility of occurrence of a crack is relatively low in the case where the angle of the stress F is 90 degrees (perpendicular) to the mounting direction D of the capacitor C and the case where the angle of the stress F is 0 degree (parallel) to the mounting direction D of the capacitor C. That is, when the mounting angle of the capacitor C is 0 degree or 90 degrees, a crack is unlikely to occur in the capacitor C.

In FIGS. 6A and 6B, the mounting angle of the capacitor C1 is 0 degree, and the mounting angle of the capacitor C2 is 90 degrees. That is, in FIGS. 6A and 6B, the stress F1 or F2 occurs in such a direction that the capacitors C1 and C2 are unlikely to be cracked.

Figure 7A:
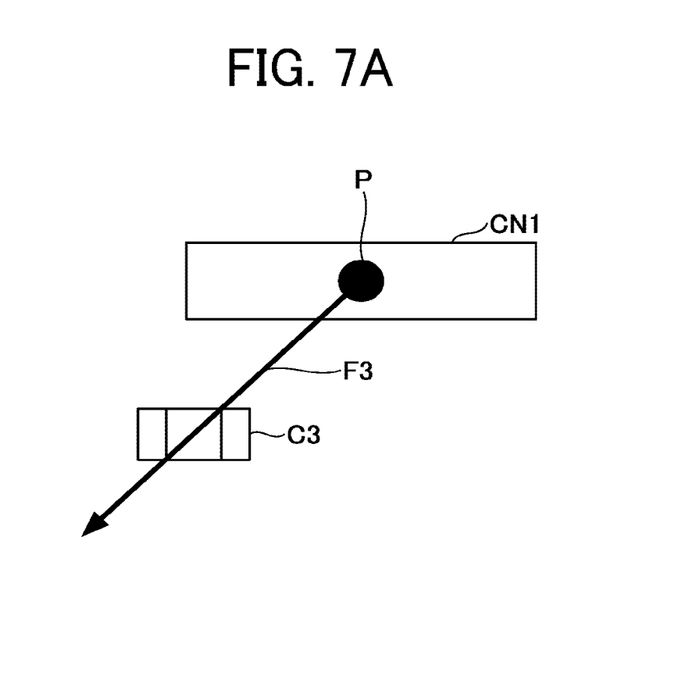
FIGS. 7A and 7B illustrate the relationship between the mounting angle of the capacitor and a likelihood of cracks in another example arrangement of the capacitor.
Figure 7B:
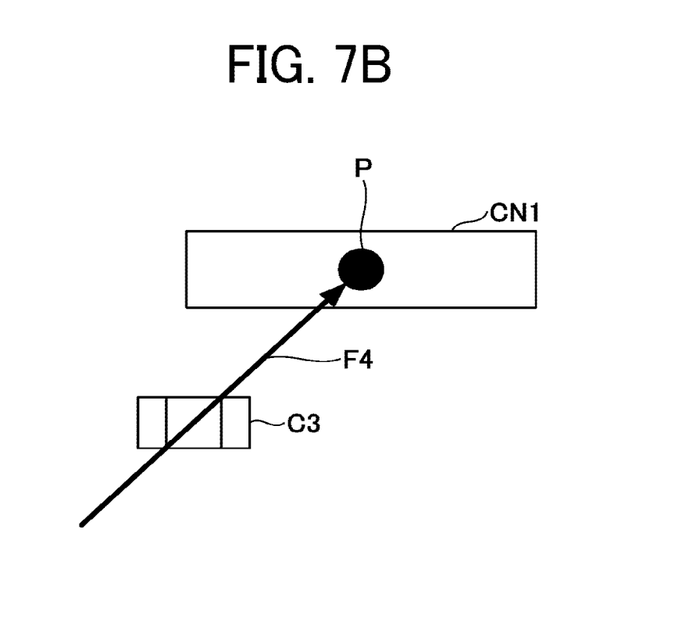

On the other hand, a description is given of a case where a capacitor C3 is placed at the position illustrated in FIGS. 7A and 7B. As illustrated in FIG. 7A, when the male connector is inserted into the female connector CN1, a stress is generated from the insertion-removal position P of the connector CN1 as indicated by arrow F3. In FIG. 7A, one arrow F3 schematically indicates a portion of the stress (hereinafter also "stress F3") radially generated from the insertion-removal position P of the connector CN1.

Further, as illustrated in FIG. 7B, when the male connector is pulled out from the female connector CN1, a stress occurs in the direction opposite to that of FIG. 7A as indicated by an arrow F4 (that is, the direction from the periphery of the connector CN1 to the insertion-removal position P). In FIG. 7B, one arrow F4 schematically indicates a portion of the stress (hereinafter also "stress F4") heading from the periphery of the connector CN1 toward the insertion-removal position P.

As described above with reference to FIGS. 3A to 3C, when the angle of the stress F is 45 degrees relative to the mounting direction D of the capacitor C, the possibility of occurrence of a crack is higher compared with the cases where the angle of the stress F is 0 degree or 90 degrees relative to the mounting direction D. That is, when the mounting angle of the capacitor C is 45 degrees, a crack is likely to occur in the capacitor C.

In FIGS. 7A and 7B, the mounting angle of the capacitor C3 is 45 degrees. That is, in FIGS. 7A and 7B, the stress F3 or F4 occurs in such a direction that the capacitor C3 is easily cracked upon insertion and removal of the connector CN1.

As the mounting angle of the capacitor approaches to 45 degrees from 0 degree, the capacitor is likely to be cracked by the stress upon insertion and removal of the connector. Similarly, as the mounting angle of the capacitor approaches to 45 degrees from 90 degrees, the capacitor is likely to be cracked by the stress upon insertion and removal of the connector.

From this viewpoint, preferably, the mounting angles of all the capacitors are 0 degree or 90 degrees. However, according to the study of the inventors, when the mounting angle is in a range of from 0 to 5 degrees or a range of from 85 or 90 degrees, the above-described effect can be as high as the case where the mounting angle is 0 degree or 90 degrees.

Specifically, the inventors executed an experiment using a plurality of types of boards in which the mounting angles of the capacitors are different. In a state where a strain gauges was on the board, a connector was inserted to and removed from the board with a predetermined force, and the amount of strain at that time was measured. Thus, the inventors studied the mounting angle with which the strain does not exceed a strain standard value that causes a crack in the capacitor. In addition, the inventors performed a simulation using a plurality of types of boards in which the mounting angles of the capacitors are different, to study the amount of strain upon insertion and removal of a connector to and from the board with a predetermined force.

From the experimental results and the simulation results, the inventors have confirmed that cracks do not occur when the mounting angle of the capacitor is within a range of 0±5 degrees or a range of 90±5 degrees.

Note that, in the description above, the male connector is inserted into and removed from the female connector mounted on the board. However, also when a female connector is inserted into and removed from a male connector mounted on the board, the same effect can be obtained by setting the mounting angles of the capacitors in the above-described angles.

In this way, the insertion-removal position of the connector can be identified, and, in designing the wiring pattern of the substrate 10, the mounting angles of the capacitors can be arranged in advance to be strong against the stress relative to the direction of the stress starting from the insertion-removal position. Such arrangement can prevent the capacitor from being cracked by the stress. As a result, a short circuit in the capacitor can be prevented, thereby preventing a short circuit between the wires via the capacitor.

The stress generated at the insertion-removal position of the connector is more easily transmitted to the capacitor when the rigidity of the substrate is low. Therefore, the lower the rigidity of the substrate 10 is, the greater the technical significance of arranging capacitors at the above-described mounting angle is.

That is, the technical significance of arranging capacitors at the above-described mounting angle is greater in a case where a resin substrate is used for the substrate 10, compared with a case where a ceramic substrate or a silicon substrate is used. For example, when a glass epoxy substrate or a phenolic paper substrate which is a resin substrate is used as the substrate 10, the technical significance of arranging capacitors at the above-described mounting angle is great.

When the wiring board 1 is relatively large, it is not necessary to set the mounting angle of the capacitors at the above-described mounting angle in the entire area of the wiring board 1. However, preferably, the capacitors located, at least, in a range within 10 mm from the periphery of the connector are arranged at the above-described mounting angle. The range within 10 mm from the periphery the connector is a range within 10 mm from the periphery of the connector in a plan view.

The "range within 10 mm from the periphery of the connector" is derived from the experimental result and the simulation result, as in the above description. Specifically, the inventors executed an experiment using a plurality of types of boards in which the mounting angles and the mounting positions of the capacitors are different. In a state where a strain gauge was on the board, a connector was inserted to and removed from the board with a predetermined force, and the amount of strain at that time was measured. Thus, the inventors studied the mounting angle and the mounting position with which the strain does not exceed a strain standard value that causes a crack in the capacitor. In addition, the inventors performed a simulation using a plurality of types of boards in which the mounting angles and the mounting positions of the capacitors are different, to study the amount of strain upon insertion and removal of a connector to and from the board with a predetermined force.

From the experimental results and the simulation results, the inventors have confirmed that a crack occurs in the range within 10 mm from the periphery of the connector unless the mounting angle of the capacitor is within a range of 0+5 degrees or a range of 90−5 degrees. On the other hand, the inventors have confirmed that, when the mounting position of the capacitor is farther than 10 mm from the periphery of the connector, in some cases, a crack does not occur even when the mounting angle of the capacitor is not in the range of 0+5 degrees or the range of 90−5 degrees.

The above-described embodiments are illustrative and do not limit the present disclosure. Thus, numerous additional modifications and variations are possible in light of the above teachings. For example, elements and/or features of different illustrative embodiments may be combined with each other and/or substituted for each other within the scope of the present disclosure.

What is claimed is:

1. A wiring board comprising:
   a substrate;
   a connector mounted on the substrate, the connector having an insertion-removal position at which a stress starts in insertion and removal of a counterpart connector into and from the connector; and
   at least one monolithic ceramic capacitor including a pair of electrodes and mounted at a mounting angle on the substrate,
   wherein, when a first line segment connects respective centers of the pair of electrodes in a plan view, and a second line segment connects a center of the insertion-removal position and a center of the first line segment in the plan view, the mounting angle is an angle between the first line segment and the second line segment and in a range of from 0 to 90 degrees, and
   wherein the mounting angle is in a range of from 0 to 5 degrees or a range of from 85 to 90 degrees in an area within 10 mm from a periphery of the connector on the substrate.

2. The wiring board according to claim 1, wherein, in a longitudinal direction of the connector, the insertion-removal position is at a center of the connector or at each end of the connector.

3. The wiring board according to claim 1, wherein the substrate is a resin substrate.

4. The wiring board according to claim 3, wherein the resin substrate is one of a glass epoxy substrate and a phenolic paper substrate.

* * * * *